(12) United States Patent
Podell et al.

(10) Patent No.: US 11,757,172 B1
(45) Date of Patent: Sep. 12, 2023

(54) CAPACITIVE SHIELDS AND METHODS FOR COUPLED TRANSMISSION LINES

(71) Applicant: Werlatone, Inc., Brewster, NY (US)

(72) Inventors: Allen F. Podell, Palo Alto, CA (US); Ky-Hien Do, Carp (CA); Michael J. Surovich, Tarrytown, NY (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 18/165,553

(22) Filed: Feb. 7, 2023

(51) Int. Cl.
  *H01Q 1/24* (2006.01)
  *H03H 7/38* (2006.01)
  *H01P 5/12* (2006.01)

(52) U.S. Cl.
  CPC ............... *H01Q 1/24* (2013.01); *H01P 5/12* (2013.01); *H03H 7/38* (2013.01)

(58) Field of Classification Search
  CPC ............... H01Q 1/24; H03H 7/38; H01P 5/12
  USPC ...................................................... 343/700 R
  See application file for complete search history.

(56) References Cited

U.S. PATENT DOCUMENTS

| | | | |
|---|---|---|---|
| 3,093,805 A * | 6/1963 | Osifchin | H01P 3/006 174/268 |
| 6,531,932 B1 | 3/2003 | Govind et al. | |
| 6,642,819 B1 | 11/2003 | Jain et al. | |
| 6,836,207 B2 | 12/2004 | Nothhelfer et al. | |
| 6,867,661 B2 | 3/2005 | Dawn et al. | |
| 6,972,639 B2 | 12/2005 | Podell | |
| 7,142,073 B2 | 11/2006 | Kim et al. | |
| 7,218,183 B2 | 5/2007 | Kim et al. | |
| 8,482,362 B1 * | 7/2013 | Podell | H01P 5/10 333/127 |
| 8,648,669 B1 * | 2/2014 | Podell | H01P 5/12 333/136 |
| 8,648,675 B1 | 2/2014 | Podell | |
| 10,418,680 B1 | 9/2019 | Podell et al. | |
| 10,418,681 B1 | 9/2019 | Podell et al. | |
| 2020/0343642 A1 * | 10/2020 | Chen | H01Q 9/28 |

* cited by examiner

*Primary Examiner* — Hai V Tran
(74) *Attorney, Agent, or Firm* — Kolisch Hartwell, P.C.

(57) ABSTRACT

A transmission-line assembly provides a transition between more coupled and less coupled transmission lines. The more coupled transmission lines may be configured as a dual stripline, and the less coupled transmission lines may be configured as separate striplines or a dual stripline with reduced coupling. In an intermediate section, the transmission conductors transition between the more coupled and less coupled sections and at least one transmission conductor bends. A grounded shield conductor is coplanar with and edge-coupled to the one transmission conductor and extends along the bend in the one transmission conductor. The shield conductor is not connected to either of the transmission conductors, and overlaps the other transmission conductor when viewed normal to the planes of the transmission conductors, whereby the shield conductor is broadside coupled to the other transmission conductor. Capacitive coupling between the transmission conductors and the shield conductor reduce capacitive coupling between the transmission conductors.

20 Claims, 3 Drawing Sheets

CAPACITIVE SHIELDS AND METHODS FOR COUPLED TRANSMISSION LINES

FIELD

This disclosure relates to coupled transmission lines, and more particularly to transmission-line bend structures associated with changes in coupling levels between transmission lines.

INTRODUCTION

Two conductive lines are coupled when they are spaced apart, but spaced closely enough together for energy flowing in one to be induced in the other. The amount of energy flowing between the lines is related to the dielectric medium the conductors are in and the spacing between the lines. Even though electromagnetic fields surrounding the lines are theoretically infinite, lines are often referred to as being closely or tightly coupled, loosely coupled, or uncoupled, based on the relative amount of coupling.

Parallel transmission lines couple both electrically and magnetically. The coupling is inherently proportional to frequency, and the directivity can be high if the magnetic and electric couplings are equal. Accordingly, two coupled lines may be analyzed based on odd and even modes of propagation. For a pair of identical lines, the even mode exists with equal voltages applied to the inputs of the lines, and for the odd mode, equal out-of-phase voltages. This model may be extended to non-identical lines, and to multiple coupled lines. For high directivity in a 50-ohm system, for example, the product of the characteristic impedances of the odd and even modes, e.g., $Zoe*Zoo$ is equal to $Zo^2$, or 2500 ohms. Zo, Zoe, and Zoo are the characteristic, even mode, and the odd mode impedances, respectively, of a coupler. Moreover, the more equal the velocities of propagation of the two modes are, the better the directivity of the coupler.

The odd mode of propagation is as a balanced transmission line. In order to have the even and odd mode velocities equal, the even mode is slowed down by an amount equal to the reduction in velocity introduced by dielectric loading of the odd mode. In compact designs used to form a multi-section coupler, for instance, coupled planar transmission lines curve or meander through one or more bends. Magnetic coupling between the layers may be strongly affected by the bends, while the capacitive coupling is largely unaffected. The result is that even mode impedance changes more than odd mode impedance around the bend.

SUMMARY

The present disclosure is directed to a transmission-line assembly providing a transition between coupled and uncoupled transmission lines. In some embodiments, a planar transmission-line assembly includes first and second transmission lines and a planar shield conductor. The first transmission line includes a planar first transmission conductor disposed in a first plane and a planar first circuit ground disposed in a second plane. The second transmission line includes a planar second transmission conductor disposed in a third plane and a planar second circuit ground disposed in a fourth plane. The first, second, third, and fourth planes are parallel and spaced apart. The first and second transmission conductors are disposed between the first and second circuit grounds.

The transmission-line assembly includes a first section in which the first transmission conductor overlaps the second transmission conductor to a first extent and the first and second transmission conductors have a first amount of broadside coupling. In a second section the first transmission conductor overlaps the second transmission conductor to a second extent that is less than the first extent and the first and second transmission conductors have a second amount of broadside coupling that is less than the first amount of broadside coupling. In an intermediate section between the first and second sections, the first transmission conductor transitions from the first section to the second section. The shield conductor is coplanar with, spaced from, adjacent to, and extends along the first transmission conductor in the intermediate section, whereby the shield conductor is edge-coupled to the first transmission conductor. The shield conductor is connected to at least the first circuit ground, is not connected to either of the first and second transmission conductors, and overlaps the second transmission conductor when viewed normal to the first plane, whereby the shield conductor is broadside coupled to the second transmission conductor.

In some embodiments, the transmission-line assembly further includes a planar second shield conductor coplanar with, spaced from, adjacent to, and extending along the second transmission conductor in the intermediate section, whereby the second shield conductor is edge-coupled to the second transmission conductor. The second shield conductor is connected to the circuit ground, is not connected to either of the first and second transmission conductors, and overlaps the first transmission conductor when viewed normal to the first plane, whereby the shield conductor is broadside coupled to the first transmission conductor.

In some embodiments, the first and second transmission conductors have uniform first widths in the first section and extend along respective parallel straight first and second lines or the same line. The first and second transmission conductors have uniform second widths in the second section and extend along respective straight third and fourth lines that are transverse to each other and transverse to the respective first and second lines. The first and second transmission conductors extend away from the intermediate section on opposite sides of the first and second lines, whereby the first and second transmission conductors are uncoupled in the second section. In the intermediate section the first transmission conductor bends from the first line to the third line and the second transmission conductor bends from the second line to the third line.

Features, functions, and advantages may be achieved independently in various embodiments of the present disclosure, or may be combined in yet other embodiments, further details of which can be seen with reference to the following description and drawings.

DESCRIPTION

Figure 1:
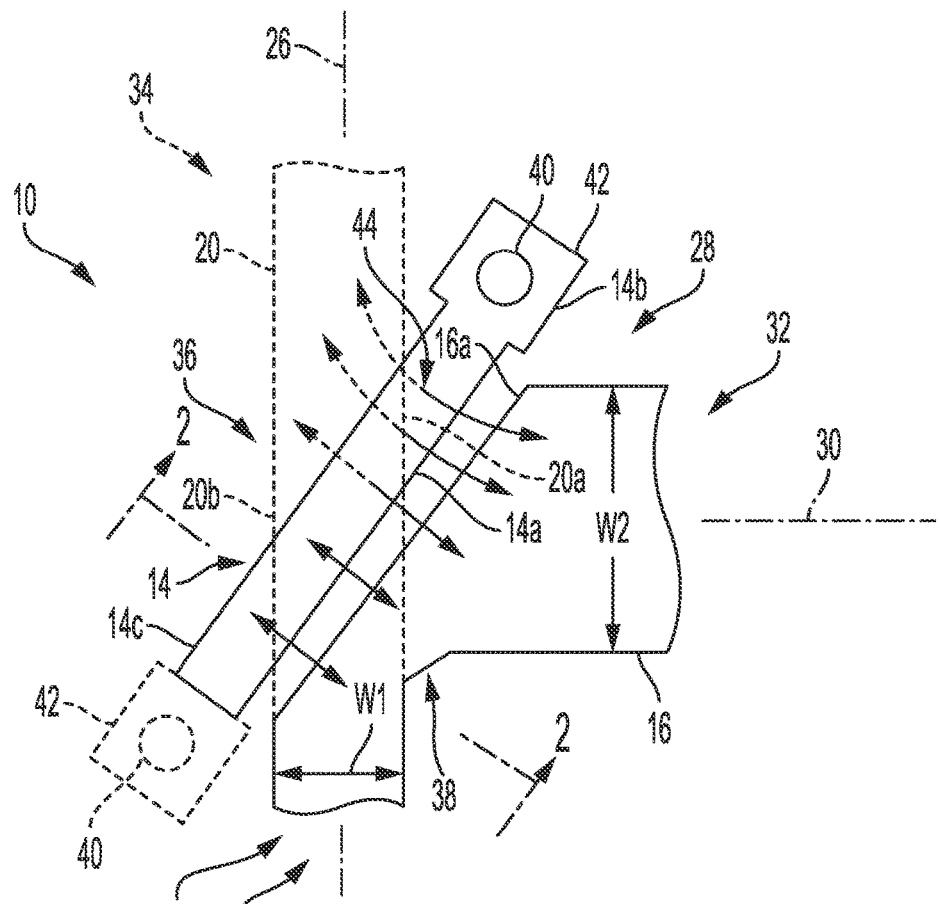
FIG. 1 is top view of a portion of a transmission-line assembly showing an example of a transition of broadside coupled transmission conductors to an uncoupled configuration.

Various embodiments of planar transmission lines having coupled signal lines or conductors that have capacitive coupling shielded or compensated, such as in a transition region that may include a bend, are described below and illustrated in the associated drawings. Unless otherwise specified, a transmission-line assembly, including a portion of a coupler having coupled lines, and/or various components of such structures may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other structures having coupled conductors. The following description of various embodiments is merely exemplary in nature and is in no way intended to limit the disclosed exemplary subject matter, its application, or uses. Additionally, the advantages provided by the embodiments, as described below, are illustrative in nature and not all embodiments provide the same advantages or the same degree of advantages.

Couplers having broadside coupled parallel lines in the region of divergence of coupled lines exhibit inter-line capacitance. As the lines diverge, magnetic coupling is reduced by the cosine of the divergence angle and the spacing, while the capacitance simply reduces with increased spacing. Thus, the line-to-line capacitance is relatively high at the ends of the coupled region.

As mentioned, many designs use cascaded sections of coupled transmission lines. In general those designs strive to keep the even-mode and odd-mode impedances of the coupled lines inversely related to the port impedance, Zp. That is, Zoe/Zp equals Zp/Zoo. This results in a reflectionless coupled-line section.

A reduction in coupling occurs when the overlapping and coupling of a pair of conductors is reduced. This reduces the conductor-to-conductor capacitive coupling and directly increases the odd-mode impedance. Maintaining a reflectionless coupled section can be achieved by sufficiently reducing the even mode impedance.

One or both conductors of a two-conductor coupled section bend in a transition from one coupling level to the next. The inductive coupling is reduced by two factors, distance between the conductors and the non-parallel magnetic field coupling. The capacitive coupling is similarly reduced by the distance between the conductors, but there is no capacitive field effect caused by the non-parallel conductors.

The even mode impedance can be reduced in the coupling transition by reducing the conductor-to-conductor capacitance preferably without reducing the magnetic coupling. A grounded shield conductor can be added near one conductor to intercept the capacitive field between the conductors and shunt it to ground, thereby reducing the cross-conductor capacitance. This shield conductor is preferably grounded once, but a second ground spaced from the first ground may be used to short out some magnetic field if that should also be desirable.

The shield conductor adds capacitance to ground for both conductors. The width of both conductors may be reduced to compensate for the added capacitance to ground. Since the conductors are on two different metal layers, two shield conductors, with one on each layer, may be used to preserve symmetry and to ease design.

An abrupt transition occurs when two coupled lines separate completely and become two uncoupled conductors. In that case, the two coupled lines diverge, turn as much as ninety degrees away from the original path, and continue uncoupled. In general, the width of the uncoupled line is more than double the width of the coupled lines, which further amplifies the benefit to be realized with the use of a shielding conductor.

In the following description, two major faces or broad sides of coupled conductors may be considered facing, for instance, if a straight line can be drawn directly between a major face of each one. Correspondingly, two major faces may be considered overlapping if a straight line normal to the major face of one conductor intersects a major face of another. These surfaces may be considered to be completely overlapping if an entire major face is overlapping with the other major face. Surfaces may thus be facing each other without being overlapping or directly opposite each other. Two planar conductors that face each other, thus, may be non-overlapping, partially overlapping, or completely overlapping.

As a practical measure, two lines may be considered to be inductively coupled when a detectable or measurable signal is coupled from one line onto the other. A threshold of coupling may be appropriate to distinguish between coupled and uncoupled lines. In most applications, two lines that have less than 20 dB inductive coupling between them are considered to be loosely coupled or uncoupled lines. In some applications, lines that have less than 100 dB of coupling are considered to be uncoupled lines. Correspondingly, lines having coupling above these values may be considered to be tightly coupled or closely coupled lines.

The amount of coupling may be defined by a coupling coefficient. Two lines may be considered to be closely coupled if the coupling coefficient is 0.1 or greater. Thus, two lines may be considered as loosely coupled or substantially uncoupled if they have a coupling coefficient of less than 0.1. "Coupled" lines or conductors are considered to be tightly or closely coupled unless otherwise indicated.

Selected aspects of exemplary transmission-line assemblies having coupling-level transitions as well as related circuit structures and/or methods are described with reference to the figures. The examples in these sections are intended for illustration and should not be interpreted as limiting the entire scope of the present disclosure. Each example may include one or more distinct inventions, and/or contextual or related information, function, and/or structure.

Figure 2:
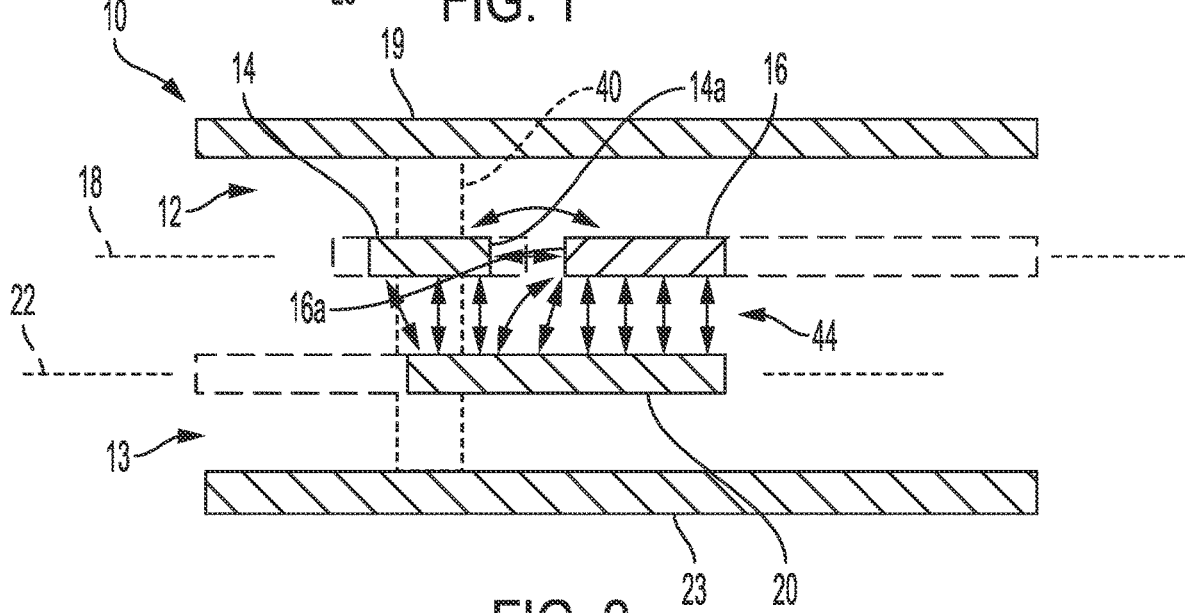
FIG. 2 is a simplified cross-section taken along line 2-2 of FIG. 1.

FIGS. 1 and 2 illustrate an example of a transmission-line assembly, shown generally at 10. Dielectric layers that separate metal layers are not shown to simplify the illustration. Transmission-line assembly 10 includes transmission lines 12 and 13, and a shield conductor 14. Transmission line 12 includes planar first transmission conductor 16 disposed in a first plane 18 spaced from and parallel to a first planar circuit ground 19, as is shown in FIG. 2. Transmission line 13 includes planar second transmission conductor 20 disposed in a second plane 22 spaced from and parallel to a second planar circuit ground 23. The planar circuit grounds are disposed along corresponding respective planes.

Transmission line 12 is seen to extend through three general sections. In a first section 24 transmission conductor 16 overlaps transmission conductor 20 to a first extent—fully in this example—and the first and second transmission conductors have a first amount of broadside coupling. In section 24, transmission conductors 16 and 20 both extend along a straight line 26 as shown in FIG. 1, and both have major faces with a common width W1. In section 24, then, transmission lines 12 and 13 are in the form of a dual stripline 25 in which transmission conductors 16 and 20 are spaced apart and disposed between planar circuit grounds 19 and 23.

Transmission lines 12 and 13 also extend in a second section 28 in which transmission conductor 16 overlaps transmission conductor 18 to a second extent that is less than the first extent and the first and second transmission conductors have a second amount of broadside coupling that is less than the first amount of broadside coupling. In this example, transmission conductor 16 extends with a uniform width W2 along a line 30 that is transverse to line 26. Line 30 is perpendicular to line 26, but lines at other angles may be used. Transmission conductor 20 continues to extend along line 26 with a uniform width W1 without overlap with transmission conductor 16. Thus, in section 28 transmission conductors 16 and 20 are uncoupled and form separate respective single striplines 32 and 34.

In an intermediate section 36, transmission conductors 16 and 20 transition between first section 24 and second section 28. Transmission conductor 16 has a 90-degree bend 38 through which the transmission conductor changes alignment between lines 26 and 30. Transmission conductor 16 also changes width between width W1 in section 24 and width W2 in section 28. In this example, transmission conductor 16 has an outer edge 16a along bend 38 that is a straight line that provides reduced overlap, and therefore reduced coupling, between transmission conductors 16 and 20 in section 36 compared to the overlap and coupling that would result from a square or right-angle corner.

Shield conductor 14 is coplanar with transmission conductor 16. The shield conductor has a proximate edge 14a that is spaced from, is adjacent to, and extends along transmission-conductor edge 16a in the intermediate section. Spacing between the shield conductor and the coplanar transmission conductor determines the amount of capacitive edge coupling provided. Preferably, the shield conductor follows the configuration of the outer edge of the transmission conductor along the bend in the intermediate section. In this example, transmission-conductor edge 16a and shield-conductor edge 14a are both straight edges and are evenly spaced-apart along the length of transmission-conductor edge 16a. Accordingly, shield conductor 14 is edge-coupled to transmission conductor 16 along transmission-conductor edge 16a. Shield conductor 14 is not connected to either of transmission conductors 16 and 20.

The shield conductor is elongate and overlaps second transmission conductor 20 between the shield conductor ends when viewed normal to the first plane as is shown in FIG. 1, whereby the shield conductor is broadside coupled to the second transmission conductor. It is seen that shield conductor 14 extends from a first end 14b proximate to a first edge 20a of transmission conductor 20 to a second end 14c proximate to a second edge 20b of transmission conductor 20 opposite edge 20a when viewed normal to planes 18 and 22.

Shield conductor 14 is connected to circuit ground at at least one location. In this example, the shield conductor is connected to circuit ground 19 by a grounding via 40. Typically, a grounding via 40 will extend between circuit ground 19 and circuit ground 23 through a grounding pad 42 at an end of the shield conductor, such as at end 14b. In some examples, shield conductor 14 is connected to circuit ground at two spaced locations, such as at opposite ends 14b and 14c. A second via 40 and associated via pad 42 at end 14c are shown in dashed lines as an alternative or optional additional configuration.

FIGS. 1 and 2 also illustrate with arrows 44 representative odd-mode capacitive coupling between transmission and shield conductors of transmission-line assembly 10. A bend at an end of a tight coupler section introduces non-TEM energy. A simple deep diagonal cut in the corner, as shown in FIG. 1, compensates for odd mode effects at the bend. However, the even mode exhibits an inductive bump in the deep diagonal corner. A grounded capacitive shield conductor across the corner adds capacitance, and does not reduce the magnetic field around the conductors unless the shield conductor is grounded at two or more spaced locations. The shield conductor is very compact and brings the even mode to the desired impedance.

The uncoupled transmission conductors in uncoupled transmission-line section 28 have increasing capacitive coupling as the transmission conductors get closer together toward coupled transmission-line section 24, but very little magnetic coupling. Even a gradual transition between coupled and uncoupled or less-coupled sections requires some form of compensation. Capacitive shield conductor 14, having a single ground point, intercepts the coupling electrostatic field between the transmission conductors around the bend without diminishing the magnetic field. This reduces the unwanted cross-capacitance. In other words, the coupling between adjacent transmission conductors is reduced and magnetic coupling is barely affected, since little current flows in the shield conductor. In applications where a reduction in magnetic coupling is desired, a second grounding via spaced from the first may be used.

Figure 3:
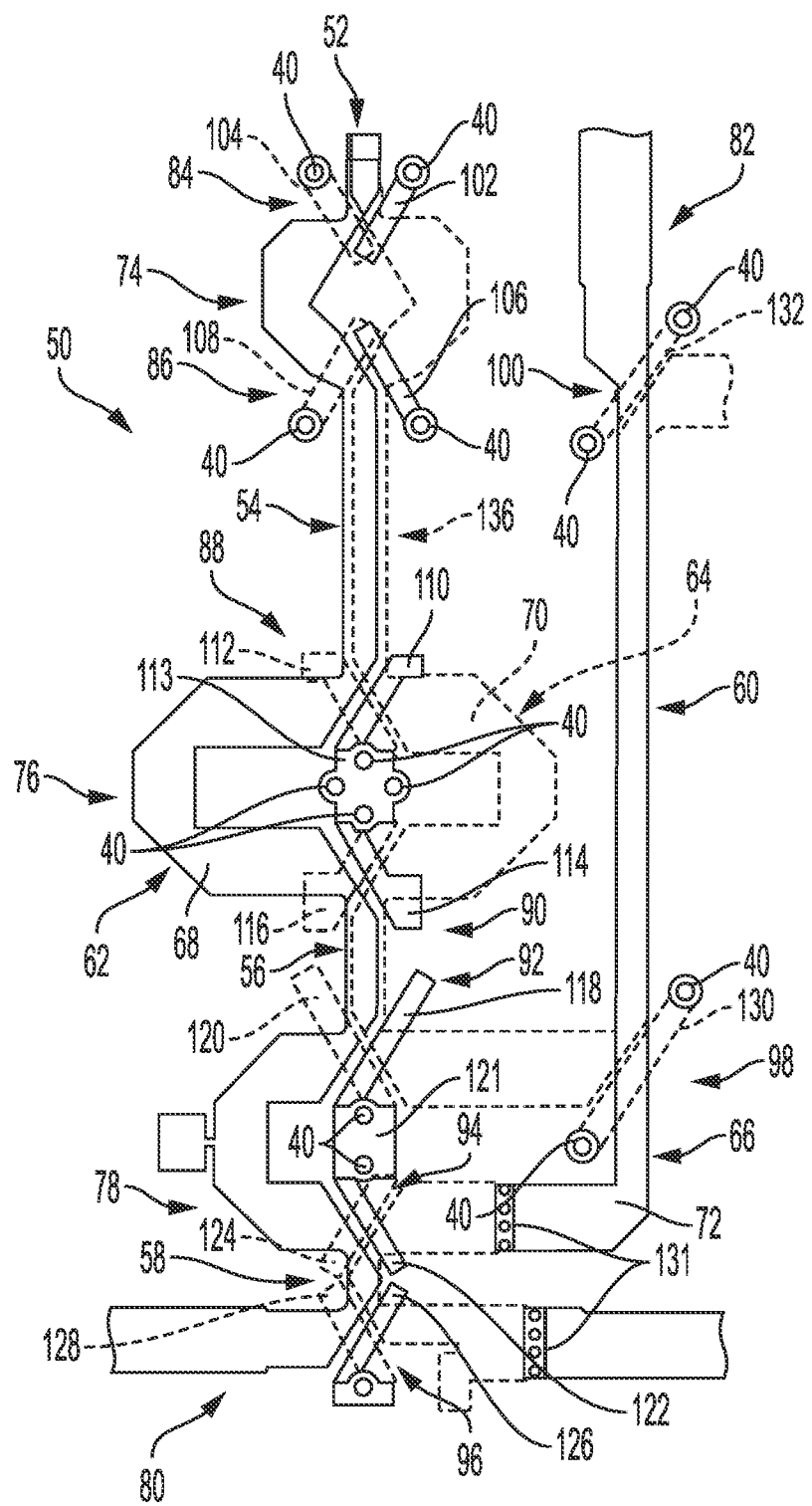
FIG. 3 is a plan view of a portion of an exemplary transmission-line assembly including cascaded broadside-coupled sections illustrating various embodiments of transitions of transmission conductors between coupled and uncoupled sections.
Figure 4:
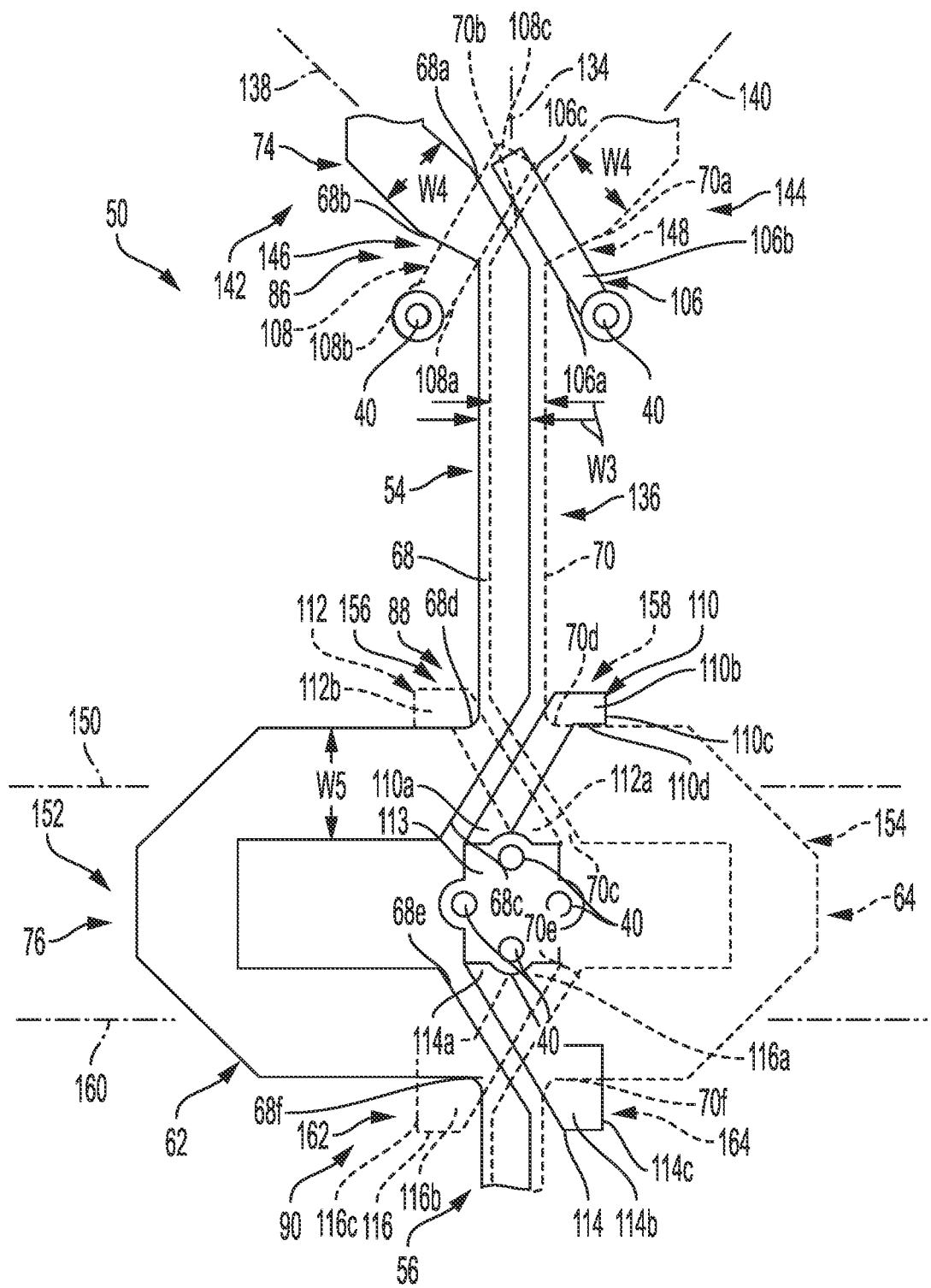
FIG. 4 is an enlargement of a portion of the transmission-line assembly shown in FIG. 3.

FIG. 3 is a plan view of a portion of an exemplary transmission-line assembly 50 forming part of a four-port network that includes cascaded broadside-coupled sections illustrating various embodiments of transitions of transmission conductors between coupled and uncoupled sections. FIG. 4 is an enlargement of a portion of transmission-line assembly 50. Only the planar levels of the transmission conductors and associated shield conductors are illustrated to facilitate an understanding of the configuration of these circuit elements. The layers in the transmission-line assembly are as is illustrated in FIG. 2.

Transmission-line assembly 50 includes tightly coupled sections 52 (shown partially), 54, 56, 58, and 60 formed by transmission lines 62, 64, and 66. Transmission lines 62, 64, and 66 include respective transmission conductors 68, 70, and 72. Coupled sections 52 and 54 are separated by uncoupled section 74. Coupled sections 54 and 56 are separated by uncoupled section 76. Coupled sections 56 and 58 are separated by uncoupled section 78. An uncoupled section 80 extends from coupled section 58 opposite uncoupled section 74. Uncoupled section 78 also extends from one end of coupled section 60 and a further uncoupled section 82 extends from the other end of coupled section 60.

An intermediate section 84 includes a transition from coupled section 52 to uncoupled section 74. An intermediate section 86 includes a transition from uncoupled section 74 to coupled section 54. An intermediate section 88 includes a transition from coupled section 54 to uncoupled section 76. An intermediate section 90 includes a transition from uncoupled section 76 to coupled section 56. An intermediate section 92 includes a transition from coupled section 56 to uncoupled section 78. An intermediate section 94 includes a transition from uncoupled section 78 to coupled section 58. An intermediate section 96 includes a transition from coupled section 58 to uncoupled section 80. An intermediate section 98 includes a transition from uncoupled section 78 to coupled section 60. An intermediate section 100 includes a transition from coupled section 60 to uncoupled section 82.

In intermediate sections 84, 86, 88, 90, 92, 94, and 96, both of the respective transmission conductors include a bend in which the transmission conductors bend from the respective coupled section in generally opposite directions away from each other. Each of these intermediate sections correspondingly include two shield conductors with one being coplanar with and edge-coupled to each associated transmission conductor. Each shield conductor overlaps with and is also broadside-coupled to the other respective transmission conductor, as was described above with reference to shield conductor 14 of transmission-line assembly 10. Accordingly, the description of transmission-line assembly 10 applies to the basic structure and function of each transition between a coupled section and an uncoupled section through an intermediate section shown in FIGS. 3 and 4.

More specifically, intermediate section 84 includes a shield conductor 102 coplanar with transmission conductor 68 and a shield conductor 104 coplanar with transmission conductor 70. Shield conductors 102 and 104 are each connected at one end to circuit ground by a single grounding via 40 and overlap at the other end.

Similarly, intermediate section 86 includes a shield conductor 106 coplanar with transmission conductor 68 and a shield conductor 108 coplanar with transmission conductor 70. Shield conductors 106 and 108 are each connected at one end to circuit ground by a single grounding via 40 and overlap at the other end.

Intermediate section 88 includes a shield conductor 110 coplanar with transmission conductor 68 and a shield conductor 112 coplanar with transmission conductor 70. Shield conductors 110 and 112 cross over and overlap each other, and are each connected at one end to a shared via pad 113 that is connected to circuit ground by four grounding vias 40.

Intermediate section 90 includes a shield conductor 114 coplanar with transmission conductor 68 and a shield conductor 116 coplanar with transmission conductor 70. Shield conductors 114 and 116 cross over each other, i.e., are transverse to each other, and are each connected at one end to circuit ground by shared via pad 113 and ground vias 40 that connect both of shield conductors 114 and 116 to circuit ground.

Intermediate section 92 includes a shield conductor 118 coplanar with transmission conductor 68 and a shield conductor 120 coplanar with transmission conductor 70. Shield conductors 118 and 120 cross over each other are each connected at one end to a shared via pad 121 that is connected to circuit ground by two grounding vias 40.

Intermediate section 94 includes a shield conductor 122 coplanar with transmission conductor 68 and a shield conductor 124 coplanar with transmission conductor 72. Shield conductors 122 and 124 cross over each other and are each connected at one end to circuit ground by shared via pad 121.

Intermediate section 96 includes a shield conductor 126 coplanar with transmission conductor 68 and a shield conductor 128 coplanar with transmission conductor 72. Shield conductors 126 and 128 cross over each other and are each connected at one end to a shared via pad 129 that is connected to circuit ground by a single grounding via 40. In this example, transmission conductor 72 is seen to transition from the level of conductor 68 to the level of conductor 70 by a series of transmission vias 131 between intermediate section 94 and intermediate section 98. Transmission conductor 72 is coplanar with conductor 70 through intermediate sections 94 and 96 and along coupled section 58 where it is broadside coupled to transmission conductor 68.

In intermediate sections 98 and 100, transmission conductor 72 continues in a straight line and transmission conductor 70 bends away from the line of the associated coupled section, as described with reference to transmission-line assembly 10 illustrated in FIG. 1. Specifically, intermediate section 98 includes a single shield conductor 130 coplanar with transmission conductor 70. Shield conductor 130 is connected to circuit ground by a via 40 at each of the two opposite ends. Similarly, intermediate section 100 includes a single shield conductor 132 coplanar with transmission conductor 70. Shield conductor 132 is connected to circuit ground by a via 40 at each of the two opposite ends.

It seen that in each of these intermediate sections, the transmission conductor has a long straight outer edge extending along the bend of the transmission conductor. The associated coplanar shield conductor extends along this outer edge, as was described with reference to intermediate section 36 in FIG. 1, and is edge-coupled to the associated coplanar transmission conductor.

An enlarged image of intermediate sections 86, 88, and 90 are illustrated in FIG. 4. In coupled sections 54 and 56, transmission conductors 68 and 70 both extend along a straight line 134, partially overlap each other, and both have major faces with a common width W3. In sections 54 and 56, transmission lines 62 and 64 are in the form of a dual stripline 136 in which transmission conductors 68 and 70 are spaced apart and disposed between planar circuit ground conductors, as is illustrated in FIG. 2 for dual stripline 25.

In uncoupled section 74, transmission conductors 68 and 70 extend without overlapping each other, and each extends with a uniform width W4 along respective lines 138 and 140 that are transverse to line 134 and also transverse to each other. In this example, lines 138 and 140 each extend at an obtuse angle relative to line 134. Thus, in section 74 transmission conductors 68 and 70 are uncoupled and form separate respective single striplines 142 and 144.

In intermediate section 86, transmission conductors 68 and 70 transition between sections 54 and 74. Transmission conductors 68 and 70 each change width between width W3 in section 54 and a wider width W4 in section 74. Transmission conductor 68 has an outer edge 68a, along a bend 146, that is a straight line that provides reduced overlap, and therefore reduced coupling, between transmission conductors 68 and 70 in section 86 compared to the overlap and coupling that would result from a corner having intersecting edges parallel to lines 134 and to lines 138 and 140.

Shield conductor 106 is coplanar with transmission conductor 68. The shield conductor has a proximate edge 106a that is spaced from, is adjacent to, and extends along transmission-conductor edge 68a of transmission conductor 68 in the intermediate section. Spacing between the shield conductor and the coplanar transmission conductor determines the amount of capacitive edge coupling provided. Preferably, the shield conductor follows the configuration of the outer edge of the transmission conductor along the bend in the intermediate section. In this example, transmission-conductor edge 68a and shield-conductor edge 106a are both straight edges and are evenly spaced-apart along the length of transmission-conductor edge 68a. Accordingly, shield conductor 106 is edge-coupled to transmission conductor 68 along transmission-conductor edge 68a. Shield conductor 106 is not connected to either of transmission conductors 68 and 70.

The shield conductor is elongate and overlaps transmission conductor 70 between the shield conductor ends when viewed normal to the plane of view of FIG. 4, whereby the shield conductor is broadside coupled to transmission conductor 70. Shield conductors 106 and 108 also overlap each other at the ends opposite from the ends connected to vias 40. It is seen that shield conductor 106 extends from a first end 106b proximate to a first edge 70a of transmission conductor 70 to a second end 106c proximate to a second edge 70b of transmission conductor 70 opposite edge 70a when viewed normal to the planes of conductors 68 and 70, which planes are parallel to the plane of view of FIG. 4.

Shield conductor 108 is coplanar with transmission conductor 70. The shield conductor has a proximate edge 108a that is spaced from, is adjacent to, and extends along a transmission-conductor edge 70b in the intermediate section. Spacing between the shield conductor and the coplanar transmission conductor determines the amount of capacitive edge coupling provided. Preferably, the shield conductor follows the configuration of the outer edge of the transmission conductor along a bend 148 in transmission conductor 70 in the intermediate section. In this example, transmission-conductor edge 70b and shield-conductor edge 108a are both straight edges and are evenly spaced-apart along the length of transmission-conductor edge 70b. Accordingly, shield conductor 108 is edge-coupled to transmission conductor 70 along transmission-conductor edge 70b. Shield conductor 108 is not connected to either of transmission conductors 68 and 70.

Shield conductor 108 is elongate and overlaps transmission conductor 68 between the shield conductor ends when viewed normal to the plane of view of FIG. 4, whereby the shield conductor is broadside coupled to transmission conductor 68. Shield conductor 108 extends from a first end 108b proximate to an edge 68b of transmission conductor 68 to a second end 108c proximate to edge 68a of transmission conductor 68 opposite edge 68b when viewed normal to the planes of conductors 68 and 70.

In uncoupled section 76, transmission conductors 68 and 70 extend without overlapping each other, and extend in opposite directions along a common line 150 from intermediate section 88 away from each other with a uniform width W5. Line 150 is perpendicular to line 134. Thus, in section 76 transmission conductors 68 and 70 are uncoupled and form separate respective single striplines 152 and 154.

In intermediate section 88, transmission conductors 68 and 70 transition between sections 54 and 76 and change width between width W3 in section 54 and a wider width W5 in section 76. Transmission conductor 68 has an outer edge 68c that is a straight line, and an inner edge 68d, along a bend 156. Similarly, transmission conductor 70 has an outer edge 70c that is a straight line, and an inner edge 70d, along a bend 158.

Shield conductors 110 and 112 form an 'X' shape in that they overlap each other between respective ends 110a and 110b, and ends 112a and 112b. Ends 110a and 112a are connected to via pad 113 at each level. The opposite ends 110b and 112b bend and extend away from coupled section 54 and extend away from respective transmission conductors 68 and 70 in a 'hockey stick' shape and along and spaced from respective transmission conductors 70 and 68 when viewed in the plane of view of FIG. 4. The distal portions of shield conductor ends 110b and 112b are spaced from respective transmission conductors 70 and 68 in uncoupled section 76 beyond the respective transmission-conductor edges 70d and 68d in respective bends 158 and 156.

End 110b of shield conductor 110 thus has a distal edge 110c opposite the transmission conductor 68 with one edge portion 110d that extends away from transmission conductor 68 and extends along adjacent edge 70d of transmission conductor 70 beyond bend 158. End edge portion 110d is spaced from and end 110b does not overlap transmission conductor 70 when viewed normal to the planes of the transmission conductors. End 112b of shield conductor 112 has a distal edge 112c opposite transmission conductor 70 with one edge portion 112d that extends away from transmission conductor 70 and extends along adjacent edge 68d of transmission conductor 68 beyond bend 156. End edge portion 112d also is spaced from and end 112b does not overlap transmission conductor 68 when viewed normal to the planes of the transmission conductors.

End 110b of shield conductor 110 and end 112b of shield conductor 112, thus, are edge coupled to respective adjacent transmission conductors 70 and 68 along edge portions 110d and 112d. However, because of the spaces between the shield conductor ends and the adjacent respective transmission conductors of the other layer, there is little additional broadside coupling between the shield conductor ends and the respective adjacent transmission conductors on the other metal layer. Each shield conductor thus contributes edge coupling to the transmission conductor on the same metal layer, as well as both edge and broadside coupling to the transmission conductor on the other metal layer.

Similarly, transmission conductors 68 and 70 extend without overlapping each other in opposite directions along a common line 160 from intermediate section 90 away from each other also with a uniform width W5. Line 160 is perpendicular to line 134. In intermediate section 90, transmission conductors 68 and 70 transition between sections 56 and 76 and change width between width W3 in section 56 and a wider width W5 in section 76. Transmission conductor 68 has an outer edge 68e, that is a straight line, and an inner edge 68f, along a bend 162. Similarly, transmission conductor 70 has an outer edge 70e, that is a straight line, and an inner edge 70f, along a bend 164.

Shield conductors 114 and 116 also form an 'X' shape in that they overlap each other between respective ends 114a and 114b, and ends 116a and 116b. Ends 114a and 116a are connected to via pad 113 at each level. The opposite ends 114b and 116b bend and extend away from coupled section 56 and extend away from respective transmission conductors 68 and 70 in uncoupled section 76 and along respective transmission conductors 70 and 68 when viewed in the plane of view of FIG. 4. The distal portions of shield conductor ends 114b and 116b extend over, i.e., overlap with, respective transmission conductors 70 and 68 in uncoupled section 76, and extend beyond the respective transmission-conductor edges 70f and 68f in respective bends 164 and 162.

End 114b of shield conductor 114, thus, has a distal edge 114c opposite the transmission conductor 68 that extends across adjacent edge 70f of transmission conductor 70 beyond bend 164. End 114b is enlarged compared to shield-conductor end 106c or shield conductor end 110b so that end 114b extends beyond transmission conductor 70 as well as over transmission conductor 70 along line 160. Similarly, end 116b of shield conductor 116 has a distal edge 116c opposite the transmission conductor 70 that extends across adjacent edge 68f of transmission conductor 68 beyond bend 162. End 116b is enlarged compared to shield-conductor end 108c or shield conductor end 112b so that end 116b extends beyond transmission conductor 70 as well as over transmission conductor 70 along line 160.

End 114b of shield conductor 114 and end 116b of shield conductor 116, thus, have increased broadside coupling to respective adjacent transmission conductors 70 and 68 as well as edge coupling from the portions that extend beyond the adjacent transmission conductors. Each shield conductor, thus, contributes edge coupling to the transmission conductor on the same metal layer, as well as both edge and extended broadside coupling to the transmission conductor on the other metal layer.

The different embodiments of the transmission-line assemblies described herein provide several advantages over known solutions for maintaining the even and odd mode impedances in transitioning the level of coupling between two adjacent transmission conductors. For example, the illustrative embodiments of transmission-line assemblies described herein allow flexibility in design for modifying the capacitive coupling of transmission conductors in the transition in coupling level.

Even mode impedance is reduced in the coupling transition by reducing the transmission conductor to transmission conductor capacitance preferably without reducing the magnetic coupling. A grounded shield conductor near one transmission conductor intercepts the capacitive field between the transmission conductors and shunts it to ground, thereby reducing the cross-conductor capacitance. This shield conductor is preferably grounded once, but a second ground spaced from the first ground may be used to short out some magnetic field if that should also be desirable.

The shield conductor adds capacitance to ground for both transmission conductors. The widths of both transmission conductors may be reduced in the transition to compensate for the added capacitance to ground. In general, the widths of the uncoupled lines are more than double the widths of the coupled lines when two coupled lines separate completely and become two uncoupled conductors, which further amplifies the benefit to be realized with the use of a shielding conductor. Since the conductors are on two different metal layers in the case of broadside-coupled striplines, two shield conductors, with one on each layer, may be used to preserve symmetry and to ease design.

Thus, the illustrative embodiments described herein are particularly useful for transitions between coupled and uncoupled sections of dual striplines. However, shield conductors can be used on certain hybrid circuits (quad or 180-degree); multistage couplers, both of uniform and non-uniform types; coupled-line filters; DC block circuits, using coupled lines; coupled-line transformers; interdigital capacitors; spiral transformers; coupled-line baluns, such as Marchand, triformer, etc.; and coupled-line delay-equalizers. However, not all embodiments described herein provide the same advantages or the same degree of advantage in all applications.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and sub combinations of the various elements, features, functions, and/or properties disclosed herein. The following claims particularly point out certain combinations and sub-combinations regarded as novel and nonobvious. Invention(s) embodied in other combinations and sub-combinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Where "a" or "a first" element or the equivalent thereof is recited, such usage includes one or more such elements, neither requiring nor excluding two or more such elements. Further, ordinal terms, such as first, second, or third, for identified elements are used to distinguish between the elements in the order in which they are introduced in a particular context, and are not intended to show serial or numerical limitation, or be fixed identifiers for the group members. Accordingly, the ordinal indicator used for a particular element may vary in different contexts. Moreover, reference to, e.g., a "second" component does not require or preclude the existence of a lower-numbered item (e.g., a "first" item) and/or a higher-numbered component (e.g., a "third" item).

What is claimed:

1. A planar transmission-line assembly comprising first and second transmission lines and a planar first shield conductor, wherein the first transmission line includes a planar first transmission conductor disposed in a first plane and a planar first circuit ground disposed in a second plane; the second transmission line includes a planar second transmission conductor disposed in a third plane and a planar second circuit ground disposed in a fourth plane; the first, second, third, and fourth planes are parallel and spaced apart; the first and second transmission conductors are disposed between the first and second circuit grounds; the transmission-line assembly includes:

a first section in which the first transmission conductor overlaps the second transmission conductor to a first extent and the first and second transmission conductors have a first amount of broadside coupling, a second section in which the first transmission conductor overlaps the second transmission conductor to a second extent that is less than the first extent and the first and second transmission conductors have a second amount of broadside coupling that is less than the first amount of broadside coupling, and an intermediate section between the first and second sections in which the first transmission conductor transitions from the first section to the second section;

the first shield conductor is coplanar with, spaced from, adjacent to, and extending along the first transmission conductor in the intermediate section, whereby the first shield conductor is edge-coupled to the first transmission conductor; and the first shield conductor is connected to at least the first circuit ground, is not connected to either of the first and second transmission conductors, and overlaps the second transmission conductor when viewed normal to the first plane, whereby the first shield conductor is broadside coupled to the second transmission conductor.

2. The transmission-line assembly of claim 1, wherein the first shield conductor is elongate and extends from a first end proximate to a first edge of the second transmission conductor to a second end proximate to a second edge of the second transmission conductor opposite the first edge of the second transmission conductor when viewed normal to the first plane.

3. The transmission-line assembly of claim 2, wherein the second end of the first shield conductor extends away from the first transmission conductor beyond the second edge of the second transmission conductor.

4. The transmission-line assembly of claim 3, wherein the second end of the first shield conductor has a distal edge opposite the first transmission conductor with one edge portion that extends away from the first transmission conductor and extends along the second edge of the second transmission conductor.

5. The transmission-line assembly of claim 4, wherein the second end of the first shield conductor having the one edge portion includes an end portion that does not overlap with the second transmission conductor when viewed normal to the first plane.

6. The transmission-line assembly of claim 5, wherein the one edge portion is spaced from an adjacent portion of the second edge of the second transmission conductor when viewed normal to the first plane.

7. The transmission-line assembly of claim 1 further comprising a planar second shield conductor coplanar with, spaced from, adjacent to, and extending along the second transmission conductor in the intermediate section, whereby the second shield conductor is edge-coupled to the second transmission conductor, and wherein the second shield conductor is connected to the circuit ground, not connected to either of the first and second transmission conductors, and overlaps the first transmission conductor when viewed normal to the first plane, whereby the first shield conductor is broadside coupled to the first transmission conductor.

8. The transmission-line assembly of claim 7 further comprising a conductive via connecting both of the first and second shield conductors to circuit ground.

9. The transmission-line assembly of claim 8, wherein the first and second shield conductors are elongate and the conductive via is connected to an end of each of the first and second shield conductors.

10. The transmission-line assembly of claim 7, wherein the first and second shield conductors are elongate and extend transverse to each other when viewed normal to the first plane.

11. The transmission-line assembly of claim 10, wherein the first and second shield conductors overlap each other at respective positions intermediate the ends of the first and second shield conductors when viewed normal to the first plane.

12. The transmission-line assembly of claim 1, wherein the first shield conductor is elongate and is connected to the circuit ground on both ends.

13. The transmission-line assembly of claim 1, further comprising a planar second shield conductor coplanar with, spaced from, adjacent to, and extending along the second transmission conductor, whereby the second shield conductor is edge-coupled to the second transmission conductor, wherein the second shield conductor is connected to the circuit ground, not connected to either of the first and second transmission conductors, and overlaps the first transmission conductor when viewed normal to the first plane, whereby the second shield conductor is broadside coupled to the first transmission conductor;

wherein the first and second transmission conductors have uniform first widths in the first section and extend along respective parallel straight first and second lines, the first and second transmission conductors have uniform second widths in the second section and extend along respective straight third and fourth lines that are transverse to each other and transverse to the respective first and second lines, the first and second transmission conductors extend away from the intermediate section on opposite sides of the first and second lines, whereby the first and second transmission conductors are uncoupled in the second section, the first transmission conductor bends from the first line to the third line in the intermediate section, and the second transmission conductor bends from the second line to the third line in the intermediate section.

14. The transmission-line assembly of claim 13, wherein the first shield conductor is elongate and extends from a first end proximate to a first edge of the second transmission conductor to a second end proximate to a second edge of the second transmission conductor opposite the first edge of the second transmission conductor when viewed normal to the first plane, and the second shield conductor is elongate and extends from a first end proximate to a first edge of the first transmission conductor to a second end proximate to a second edge of the first transmission conductor opposite the first edge of the first transmission conductor when viewed normal to the first plane.

15. The transmission-line assembly of claim 14, wherein the second end of the first shield conductor extends away from the first transmission conductor beyond the second edge of the second transmission conductor, and the second end of the second shield conductor extends away from the second transmission conductor beyond the second edge of the first transmission conductor.

16. The transmission-line assembly of claim 15, wherein the second end of the first shield conductor has a distal edge opposite the first transmission conductor with one edge portion that extends away from the first transmission conductor and extends along the second edge of the second transmission conductor, and the second end of the second shield conductor has a distal edge opposite the second transmission conductor with one edge portion that extends away from the second transmission conductor and extends along the second edge of the first transmission conductor.

17. The transmission-line assembly of claim 16, wherein the second end of the first shield conductor having the one edge portion includes an end portion that does not overlap with the second transmission conductor when viewed normal to the first plane, and the second end of the second shield conductor having the one edge portion includes an end portion that does not overlap with the first transmission conductor when viewed normal to the first plane.

18. The transmission-line assembly of claim 17, wherein the one edge portion of the first shield conductor is spaced from an adjacent portion of the second edge of the second transmission conductor when viewed normal to the first plane, and the one edge portion of the second shield conductor is spaced from an adjacent portion of the second edge of the first transmission conductor when viewed normal to the first plane.

19. The transmission-line assembly of claim 13, wherein the first and second shield conductors are elongate and extend transverse to each other when viewed normal to the first plane.

20. The transmission-line assembly of claim 19, wherein the first and second shield conductors have opposite ends and overlap each other at respective positions intermediate the ends of the first and second shield conductors when viewed normal to the first plane.

* * * * *